United States Patent [19]

Eaton et al.

[11] Patent Number: 4,576,224
[45] Date of Patent: Mar. 18, 1986

[54] DIAMOND HEATSINK ASSEMBLIES

[75] Inventors: Ralph M. Eaton; Michael W. Geen, both of Northampton, England

[73] Assignee: Plessey Overseas Limited, Ilford, England

[21] Appl. No.: 651,466

[22] Filed: Sep. 17, 1984

[30] Foreign Application Priority Data

Sep. 21, 1983 [GB] United Kingdom ............... 8325320

[51] Int. Cl.$^4$ ........................................... H01L 23/40
[52] U.S. Cl. .................................. 165/80.2; 165/80 A; 165/185; 357/81; 361/386; 361/388
[58] Field of Search ............... 165/80 R, 80 A, 80 B, 165/80 C, 80 D, 185; 357/81; 361/386, 387, 388

[56] References Cited

U.S. PATENT DOCUMENTS

| 2,233,660 | 3/1941 | Barnes | 165/185 X |
|---|---|---|---|
| 3,476,177 | 11/1969 | Potzl | 165/80 B |
| 3,495,131 | 2/1970 | Melcher | 361/388 X |
| 3,678,995 | 7/1972 | Collard | 165/185 |
| 3,721,289 | 3/1973 | Seal | 165/185 X |
| 3,744,560 | 7/1973 | Sell, Jr. | 165/185 |
| 3,828,848 | 8/1974 | Custers et al. | 165/185 X |
| 3,908,188 | 9/1975 | Kawamoto | 357/81 X |
| 3,949,263 | 4/1976 | Harper | 165/185 X |
| 3,972,012 | 7/1976 | Liu | 333/84 M |
| 4,167,031 | 9/1979 | Patel | 361/388 |
| 4,232,277 | 11/1980 | Dickens | 331/107 DP |
| 4,420,767 | 12/1983 | Hodge et al. | 357/81 |
| 4,426,704 | 1/1984 | Tanashi et al. | 372/50 |

FOREIGN PATENT DOCUMENTS

| 242052 | 11/1962 | Australia | 165/80 B |
|---|---|---|---|
| 767963 | 2/1957 | United Kingdom | 165/185 |
| 887568 | 1/1962 | United Kingdom | 165/80 C |
| 1120926 | 7/1968 | United Kingdom . | |

OTHER PUBLICATIONS

Ino et al, 80 GHz Silicon Diamond-Heatsink IMPATT Diodes, Electronic Letters, vol. 15, No. 1 (1/4/79) pp. 2-3.

Primary Examiner—Sheldon J. Richter
Assistant Examiner—Randolph A. Smith
Attorney, Agent, or Firm—Fleit, Jacobson, Cohn & Price

[57] ABSTRACT

A diamond heatsink for semiconductor devices comprises a stud into which the diamond is pressed. The stud is held by friction in the end of a hollow split cylindrical holder. The holder is clamped in a base or wall member by a locknut which is screwed into the base or wall member and urges two half-conical collets into contact with the holder. The holder is also mounted by a screw thread in the locknut to allow the position of the semiconductor device to be adjusted.

7 Claims, 2 Drawing Figures

DIAMOND HEATSINK ASSEMBLIES

BACKGROUND OF THE INVENTION

1. Field of the Invention

This invention relates to diamond heatsink assemblies which are particularly suitable for mounting small electronic devices thereon which emit a relatively high degree of heat.

2. Description of the Related Art

It is known to provide a diamond as a heatsink for such devices because the thermal conductivity of a diamond mounted on a suitable metal member of high thermal conductivity is at least twice that of a metal member without the diamond. The metal member usually comprises a threaded stud of gold, silver or copper with the diamond pressed into the end, the stud being adapted to be screwed into a base or wall member until the end of the stud is substantially aligned with the surface of the base or wall member with the electronic device mounted centrally on the diamond. The electronic device may, for example project into a waveguide.

One problem with this arrangement is that the electronic device cannot be independently rotated on the stud to align the electronic device at a particular position relative to say a waveguide. Another problem that an all threaded stud has is poor electrical and thermal contact with the base or wall member because of the small area of actual contact between the screw threads. A further problem is that the threaded stud must be replaced if the electronic device becomes faulty.

It is an object of the present invention therefore to eliminate or reduce these problems.

SUMMARY OF THE INVENTION

According to the present invention a diamond heatsink assembly comprises a diamond mounted on a high conductivity metal mounting member, the mounting member being removably secured in a securing member, the securing member being adapted to be clamped in an orifice in a base or wall member by clamping means, the clamping means being operative to react with the sides of the orifice to clamp the securing member in the base or wall member, the clamping means reacting with the sides of the orifice when acted upon by clamp locking means.

Preferably the diamond is pressed into the mounting member so that the surface of the diamond is substantially flush with the surface of the mounting member.

Preferably the mounting member is cylindrical in shape with the diamond pressed into the end surface thereof. The diamond may have a metal coating applied thereto before being pressed into the mounting member.

The securing member may comprise an elongate hollow cylinder with slots in its wall extending from one end to a position intermediate of the ends to provide a degree of resilience to the walls at that end, the mounting member being held in the split end having the slots.

Preferably the orifice comprises a conical hole and the clamping means comprises a split frusto-conical member or a plurality of part frustro-conical collets which clamp the split end of the securing member when forced into the conical hole.

The locking means preferably comprises a threaded member which is mounted in a threaded portion of the base or wall member communicating with the conical hole whereby tightening of the threaded member urges the split conical member or the plurality of collets into contact with the sides of the conical hole to clamp the split end of the securing member in the base or wall member.

The securing member is preferably threadedly mounted in the locking means whereby the securing member, the mounting member and an electronic device mounted on the mounting member can be rotated relative to the base or wall member.

BRIEF DESCRIPTION OF THE DRAWINGS

An embodiment of the invention will now be described by way of example only with reference to the accompanying drawings in which.

DESCRIPTION OF THE PREFERRED EMBODIMENT

Figure 1:
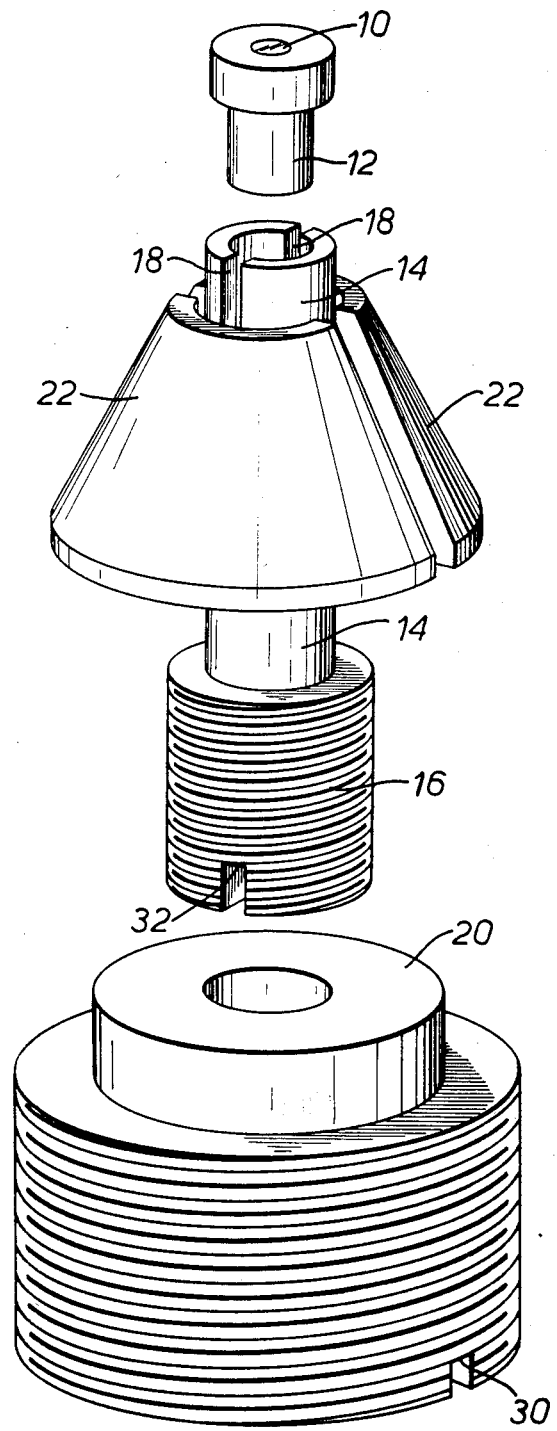
FIG. 1 is an exploded view of a diamond heatsink assembly according to the invention and, FIG. 2 is a cross-sectional view of the assembly mounted in a base on which is supported a waveguide.

Referring now to FIG. 1, a 2A type diamond 10 is metallised and pressed into the end of a cylindrical stud 12 made of gold, silver or copper until the surface of the diamond is substantially flush with the end face of the stud 12. The stud is held in the end of a holder 14 which has a screw thread 16 at one end and a hollow cylindrical portion at the other end which has two opposed slots 18 formed in it. The walls of the cylindrical portion having the grooves 18 are therefore resilient and can be squeezed inwardly to tightly grip the stud 12. The holder 14 is screw threadedly mounted in a lock nut 20 which is adapted to be screwed into a threaded hole formed in a base or wall. The hole has a conical portion into which two frusto-conical collets 22 are first fitted. The stud 12, holder 14 and locknut 20 are inserted into the hole between the two collets 22. The lock nut 20 is screwed into the base or wall causing the stud 12, holder 14 and the collets 22 to move further inside the hole. The collets 22 move towards each other squeezing the holder to grip the stud 12.

Figure 2:
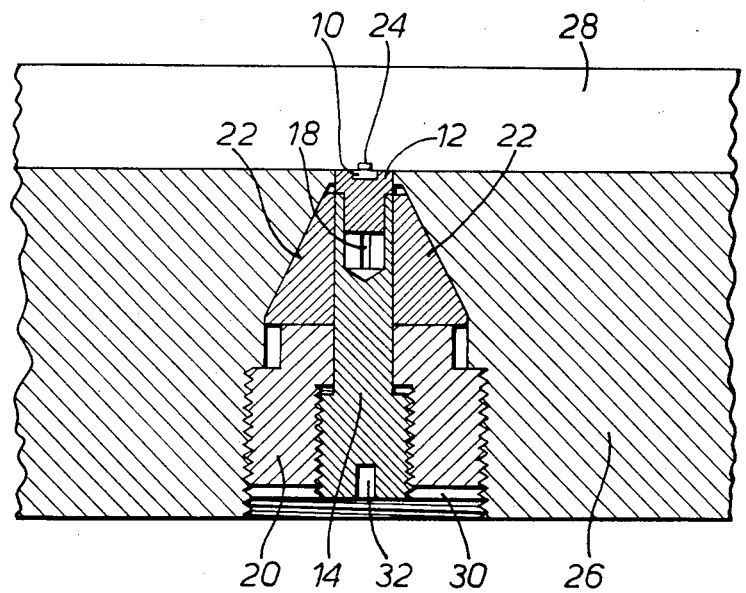

In FIG. 2 the heatsink is shown assembled with a microwave semiconductor device 24 mounted on the diamond 10. The heatsink assembly is mounted in a base 26 on which is located a waveguide 28. The diameter of the diamond 10 is greater than that of the device 24 to allow the heat from the device to spread in a more or less conical flow pattern, the device being mounted substantially centrally on the diamond.

By slightly loosening the locknut 20 the collets 22 are loosened, and the holder 14 can be rotated to position the device 24 at any angle within the waveguide 28. The locknut and the holder are provided with slots 30 and 32 respectively to permit the insertion of a suitable tool.

The assembly has very good heatsinking properties due to the mass of heat conductive metal contacting the stud 12 and good electrical contact is obtained by the holder 14 and collets 22. This is important particularly for millimeter wave applications.

The arrangement is also particularly easy to assemble and the stud 12 can be replaced without replacing any of the threaded parts.

What we claim is:
1. A diamond heatsink assembly comprising:
    (a) a mounting member including an outer surface in which is positioned a diamond;

(b) a holder member for holding said mounting member;
(c) a clamping member for securing said mouning member and said holder member, said clamping member being of split frusto-conical shape and including a base surface and a bore in which said mounting member and said holder member are inserted;
(d) a locking member; and
(e) a base member including
 (i) a recess of corresponding shape to that of said clamping member and
 (ii) first and second openings on respective sides of said recess, said first opening receiving said mounting member and said second opening receiving said locking member, said locking member axially movably positioned within said base member and adjacent said base surface of said clamping member for forcing said clamping member against said recess to clamp said clamping member against said holder member and to clamp said holder member against said mounting member to prevent rotation of said mounting member and to retain said mounting member with its outer surface substantially planar with a surface of said base member.

2. A diamond heatsink assembly as claimed in claim 10 wherein the mounting member is cylindrical.

3. A diamond heatsink assembly as claimed in claim 1 wherein the holder member has first and second ends and comprises an elongate hollow cylinder having a plurality of slots in a wall thereof, said slots extending longitudinally from an outer end to an inner end of said cylinder to a position intermediate the ends of the holder member to form a split end and provide additional resilience in the wall of the cylinder at the outer end thereof in which said mounting member is held.

4. A diamond heatsink assembly as claimed in claim 3 wherein the holder member includes a threaded member to be threaded onto a correponding member on a base which communicates with a conical hole which receives the heatsink assembly, thus tightening of the threaded member urges the clamping member into contact with the sides of the conical hole to clamp the split end of the holder member around the mounting member.

5. A diamond heatsink assembly as claimed in claim 4 wherein the holder member is threadedly mounted in the locking member; the holder member, the mounting member and an electronic device mounted on the mounting member can be rotated relative to the base member by loosening and tightening the holder member.

6. A diamond heatsink assembly as claimed in claim 1 wherein the clamping member includes a longitudinally split frusto-conical member.

7. A diamond heatsink assembly as claimed in claim 1 wherein the clamping member includes a plurality of part frusto-conical collets.

* * * * *